(12) United States Patent
Linliu

(10) Patent No.: US 6,303,431 B1
(45) Date of Patent: Oct. 16, 2001

(54) METHOD OF FABRICATING BIT LINES

(75) Inventor: Kung Linliu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/393,610

(22) Filed: Sep. 10, 1999

(30) Foreign Application Priority Data

Jul. 16, 1999 (TW) .................................................. 88112072

(51) Int. Cl.⁷ ................................................ H01L 21/8242
(52) U.S. Cl. ..................... 438/253; 438/396; 438/626; 438/633; 438/634; 438/636; 438/637; 438/672; 438/692; 438/697
(58) Field of Search .................................. 438/253, 254, 438/255, 396, 397, 398, 672, 624, 626, 631, 633, 634, 636, 637, 638, 669, 692, 697

(56) References Cited

U.S. PATENT DOCUMENTS

| | | | |
|---|---|---|---|
| 5,807,779 | * | 9/1998 | Liaw .................................... 438/279 |
| 5,885,895 | * | 3/1999 | Liu et al. ............................... 438/637 |
| 5,907,781 | * | 5/1999 | Chen et al. ............................ 438/303 |
| 6,025,255 | * | 2/2000 | Chen et al. ............................ 438/595 |
| 6,071,802 | * | 6/2000 | Ban et al. ............................. 438/618 |

* cited by examiner

*Primary Examiner*—Carl Whitehead, Jr.
*Assistant Examiner*—Tomae M. Thomas
(74) *Attorney, Agent, or Firm*—Jiawei Huang; J.C. Patents (57) ABSTRACT

A method of fabricating bit lines is described. A semiconductor substrate has isolation structures formed therein. Gate structures are formed over the semiconductor substrate. Each gate structure comprises a conducting gate layer and a cap layer on the conducting gate layer. A common source and a drain is formed in the semiconductor substrate. A spacer is formed on the sidewall of each gate structure. A dielectric layer is formed over the semiconductor substrate. The dielectric layer is patterned to form bit line contact holes and bit line trenches, wherein the bit line contact holes expose the common sources, and the bit line trenches expose a part of the cap layer and a part of the isolation structures. The bit line contact holes and the bit line trenches are filled with a conducting layer; consequently, bit line contacts and patterned bit lines are formed.

22 Claims, 6 Drawing Sheets

METHOD OF FABRICATING BIT LINES

CROSS-REFERENCE TO RELATED APPLICATION

This application claims the priority benefit of Taiwan application serial no. 88112072, filed Jul. 16, 1999, the full disclosure of which is incorporated herein by reference.

BACKGROUND OF THE INVENTION

1. Field of the Invention

The present invention relates to a method of fabricating an integrated circuit, and more particularly to a method of fabricating a bit line.

2. Description of the Related Art

The cost of the integration circuit process is usually high. Reducing the use of masks can reduce the number of process steps, and thus makes fabrication of the integrated circuit more economical.

For example, the conventional process for fabricating bit line contacts and bit lines requires many steps. The first step is to form a dielectric layer over the substrate. Then, the dielectric layer is covered with a patterned photoresist layer that is applied to define the dielectric layer. An etching process is performed to form a bit line contact opening in the dielectric layer, using the photoresist layer as mask. The bit line contact opening is filled with a conducting layer to form a bit line contact. Next, the substrate is covered with another conducting layer that is applied to form a bit line. The other patterned photoresist layer is formed on the second conducting layer to define the second conducting layer. The second conducting layer is etched to form the bit line.

Since at least two masks are needed to fabricate bit line contacts and bit lines in the prior art integration circuit process, the process window is limited and the cost is burdensome.

SUMMARY OF THE INVENTION

The invention provides a method of fabricating bit lines. A semiconductor substrate having isolation structures formed therein is provided. Gate structures are formed over the semiconductor substrate. Each gate structure comprises a conducting gate layer and a cap layer on the conducting gate layer. A common source and a drain are formed in the semiconductor substrate. A spacer is formed on the sidewall of each gate structure. A stop layer is formed on the semiconductor. A dielectric layer is formed over the stop layer. The dielectric layer is patterned to form bit line contact holes and bit line trenches, wherein the bit line contact holes expose the common sources, and the bit line trenches expose a part of the cap layer and a part of the isolation structures. A conducting layer is formed to fill the bit line contact holes and the bit line trenches to form bit line contacts and patterned bit lines therein. The bit line contact holes and the bit line trenches are formed with the use of only one mask, so that the present invention can be used to reduce the number of process steps and the process cost.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
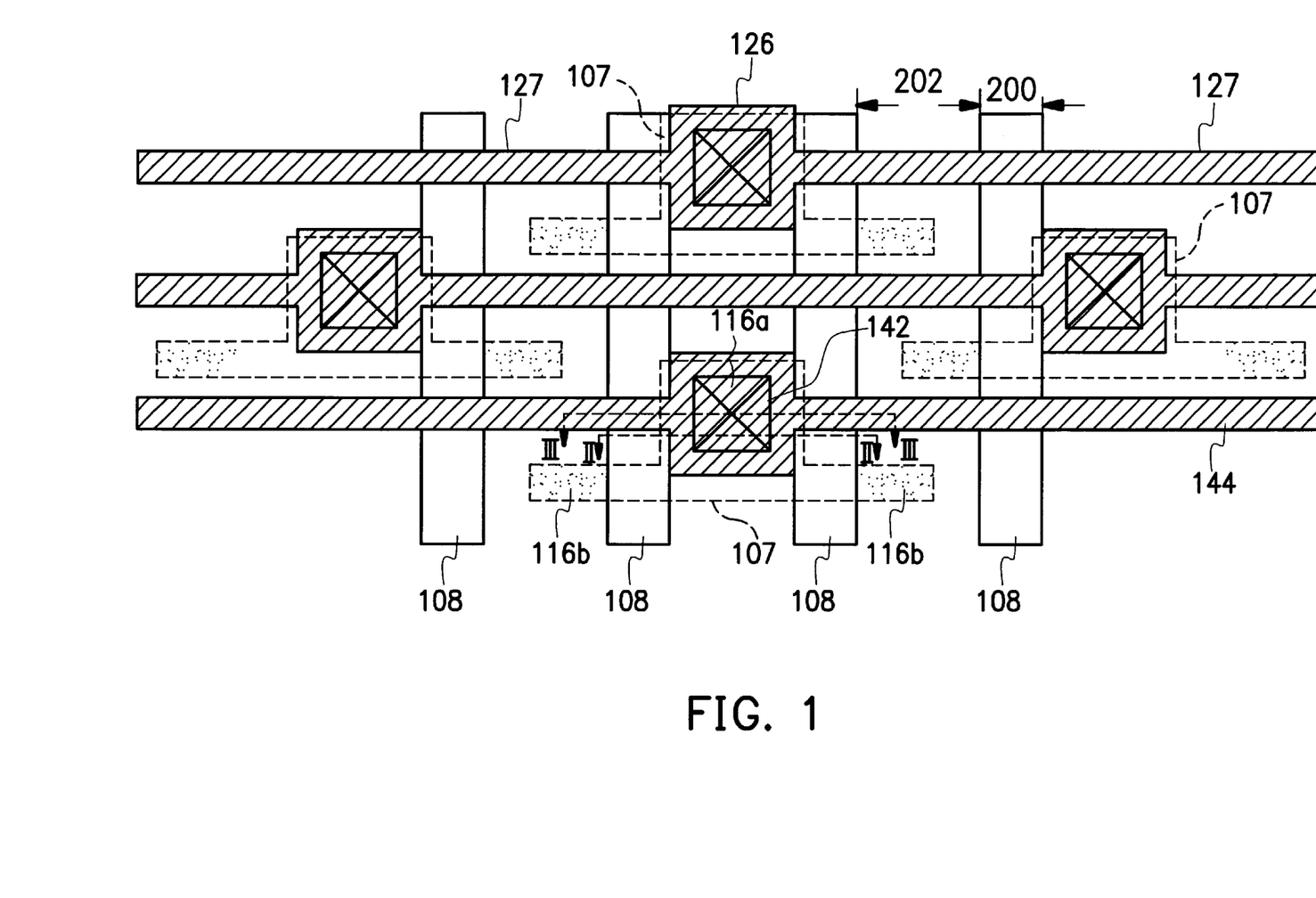
FIG. 1 is a schematic, top view illustrating a semiconductor fabricated according to preferred embodiment of the method according to the present invention.
Figure 2A:
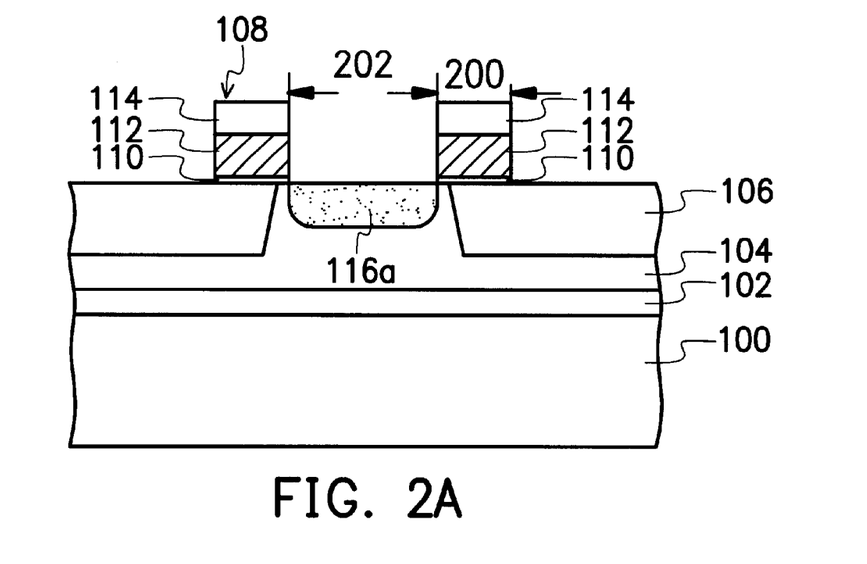
FIGS. 2A–2E are schematic, cross-sectional views along line II—II, illustrating a method of fabricating the bit lines in FIG. 1.
Figure 3A:
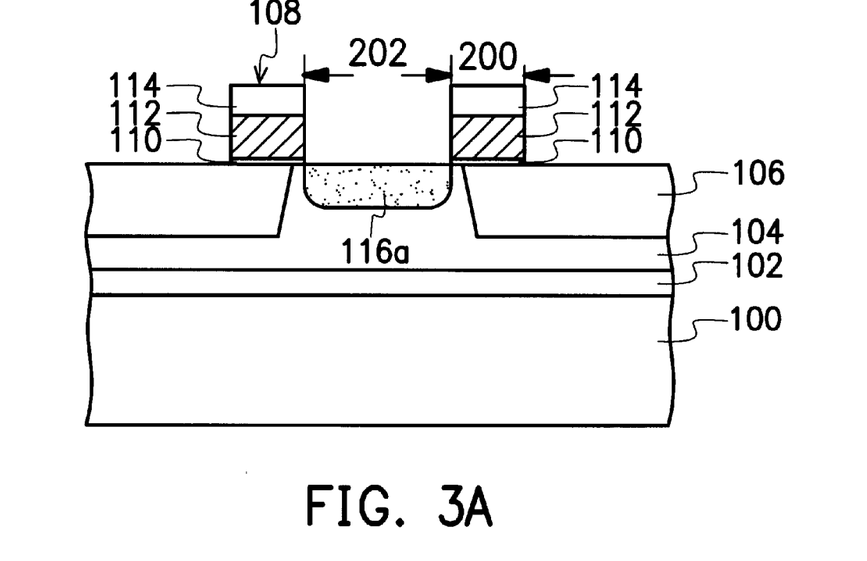
FIGS. 3A–3E are schematic, cross-sectional views along line III—III, illustrating of a method of fabricating the bit lines of FIG. 1.

Referring to FIGS. 1, 2A and 3A, a semiconductor substrate 100 having isolation structures 106 formed therein is provided. The isolation structures 106 are used to define active regions 107. The regions indicated by dotted lines in FIG. 1 are active regions 107. A deep well 102 and a shallow well 104 are formed in the active region 107. In the two wells 102 and 104, one is n-well, and the other is p-well. Which one is n-well or p-well depends on the design of the IC device. For example, the deep well 102 is an n-well, and the shallow well 104 is a p-well, or alternatively, the deep well 102 is a p-well while the shallow well 104 is an n-well.

Gate structures 108 are formed over the semiconductor substrate 100. The line width 200 of the gate structures 108 is, for example, about 0.24 micrometers. The distance 202 between the two neighboring gate structures 108 is, for example, about 0.36 micrometers.

Each of the gate structures 108 comprise a gate oxide layer 110, a conducting gate layer 112 and a cap layer 114. The gate oxide layer 110 is formed by thermal oxidation, preferably to a thickness of about 80 Angstroms. A material of the conducting gate layer 112 is doped polysilicon formed by, for example, a CVD process. The material of the conducting gate layer 112 can also comprise a doped polysilicon layer and a metal silicide, both formed using a chemical vapor deposition (CVD) process. A preferred thickness of the doped polysilicon layer is about 1500 Angstroms. A preferred thickness of the metal silicide is about 1200 Angstroms. Another material that also can be used for the conducting gate layer 112 is metal. A material of the cap layer 114 comprises silicon nitride, for example, deposited by CVD, preferably to a thickness of about 2000 Angstroms.

Common sources 116a and drains 116b are formed in the semiconductor substrate 100 between the gate structures 108. The common sources 116a and drains 116b are formed in the shallow well 104 by, for example, an implant process.

Figure 2B:
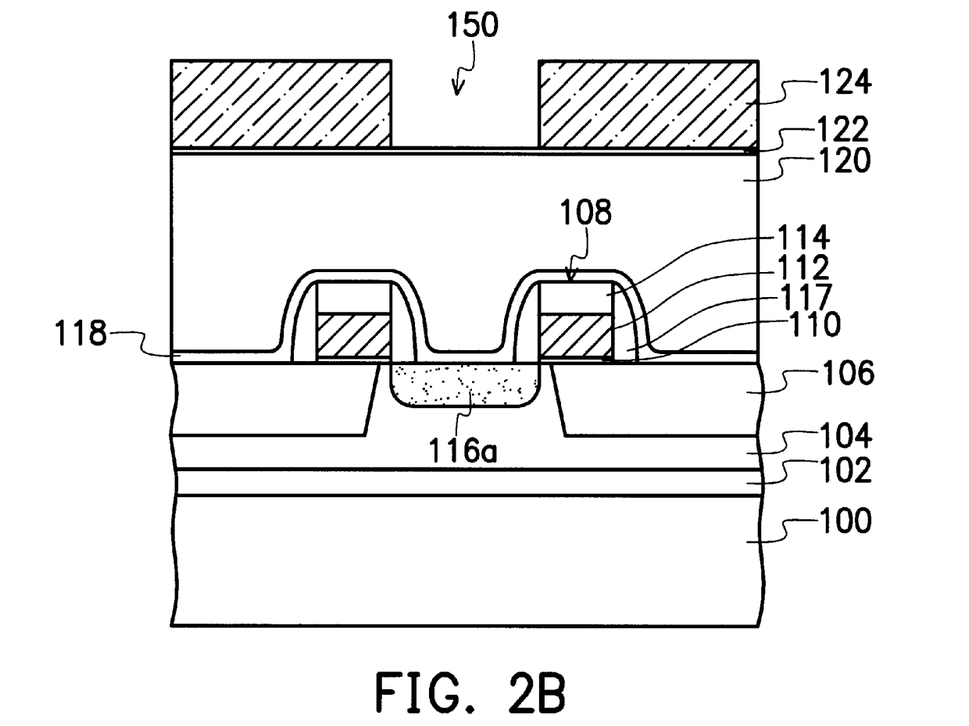
Figure 3B:
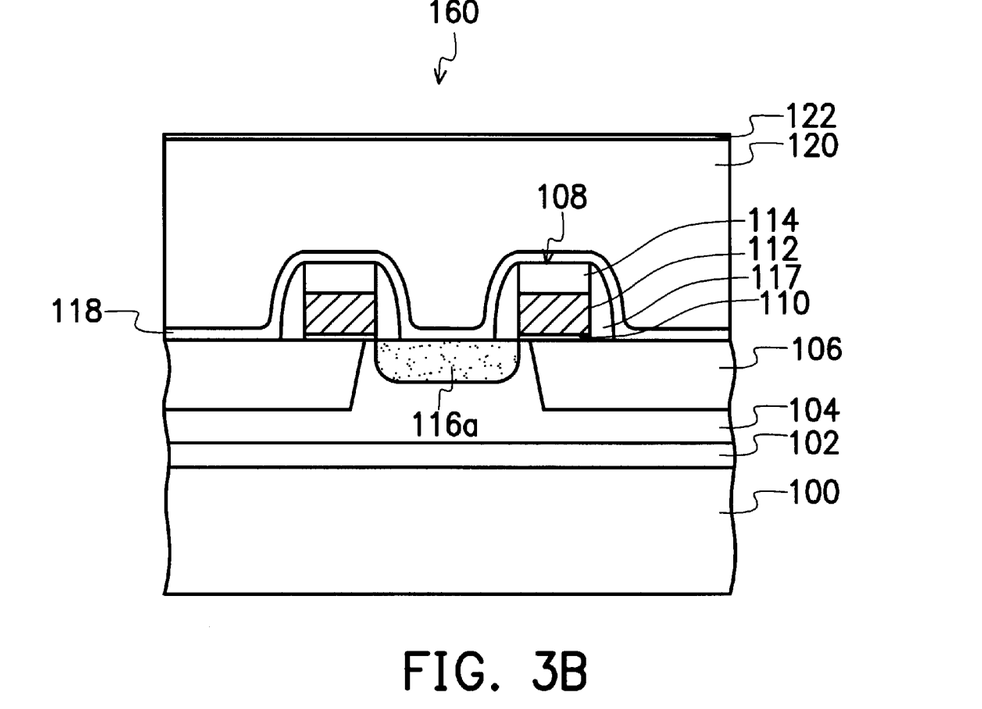

Referring to FIGS. 1, 2B and 3B, spacers 117 are formed on the sidewall of each gate structure 108. A material of the spacers 117 comprises silicon nitride, for example, deposited by CVD.

A stop layer 118 is formed over the semiconductor substrate 100. In this embodiment, the stop layer 118 covers the gate structure 108, the exposed shallow well 104, and the exposed isolation 106. A material of the stop layer 118 is, for example, silicon nitride formed by a CVD process, preferably to a thickness of about 300 Angstroms. A dielectric layer 120 is formed over the semiconductor 100, preferably to a thickness of about 5000 to about 10000 Angstroms. A material suitable for forming the dielectric layer 120 comprises, for example, silicon oxide, phosphosilicate glass (PSG) or borophosphosilicate glass (BPSG) formed by CVD, or spin-on-glass formed by spin coating. The dielectric layer 120 is preferably planarized by, for example, a chemical mechanical polishing process in order to provide a smooth surface for subsequent processes.

A bottom anti-reflection coating (BARC) layer 122 is formed on the dielectric layer 120. The BARC layer 122 comprises, for example, organic materials or inorganic materials. One inorganic materials is, for example, silicon oxy nitride. A patterned photoresist layer 124 is formed on the BARC layer 122. The patterned photoresist layer 124 having a pattern for bit line contact openings 150 and a pattern for bit line trenches 160 is used to define the dielectric layer 120. The pattern for bit line contact openings 150 is located over the common source 116a. The pattern for bit line trench 160 is located over the part of isolation structures 106 and the part of the cap layer 114. The pattern for bit line trench 160 is not shown in FIG. 3B.

Figure 2C:
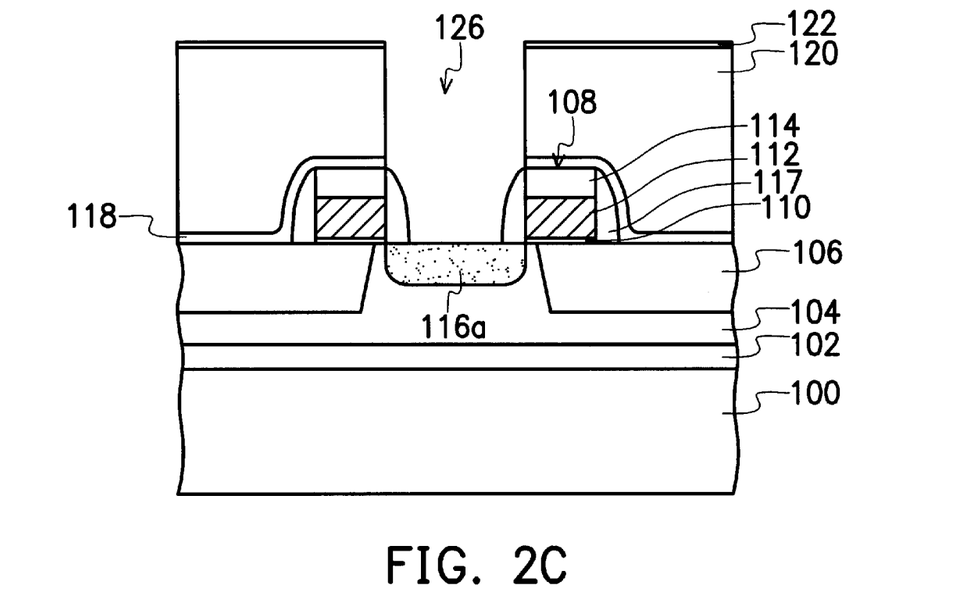
Figure 3C:
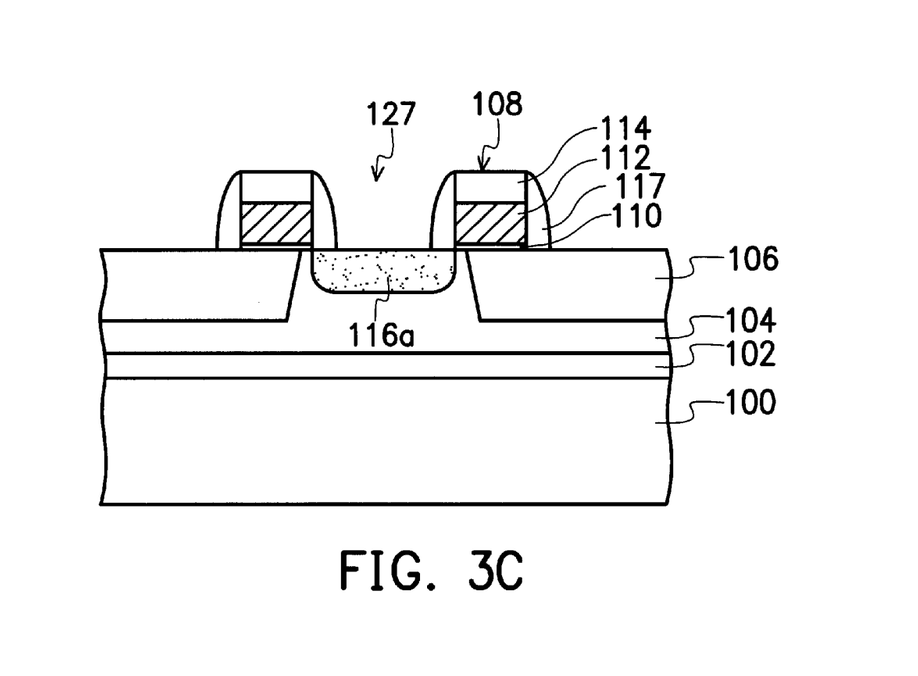

Referring to FIG. 1, 2C and 3C, etching processes are performed on the BARC layer 122 the dielectric layer 120 and the stop layer 118, using the patterned photoresist layer 124 as mask, in order to form bit line contact holes 126 and bit line trenches 127 therein. The bit line contact holes 126 expose the common source 116a on the semiconductor substrate 100, as shown in FIG. 2C. In this embodiment, the bit line trenches 127 expose the part of the cap layer 114 and the part of the isolation structures 106, as shown in FIG. 3C. The etching processes are preferably performed in two steps. The first etching step is performed by, for example, anisotropic etching, such as a plasma process, with $CF_4$, $CHF_3$ or $C_2F_6$, and $C_3F_8$ as gas sources, through the dielectric layer 120 until the stop layer 118 is exposed. The second etching step is performed by, for example, anisotropic etching, such as a plasma process, with $CHF_3$ and $O_2$ as gas sources. The second etching step is performed through the stop layer 118 until the common source 116a, a part of the cap layer 114, and a part of the isolation structures 106 are exposed; consequently, the bit line contact holes 126 and bit line trenches 127 are formed. The bit line contact holes 126 and the bit line trenches 127 are formed in one photolithography process which use one mask only, so that the present invention can be used to reduce the number of process steps and the process cost. Then, the patterned photoresist layer 124 is removed using, for example, $O_2$ plasma.

Figure 2D:
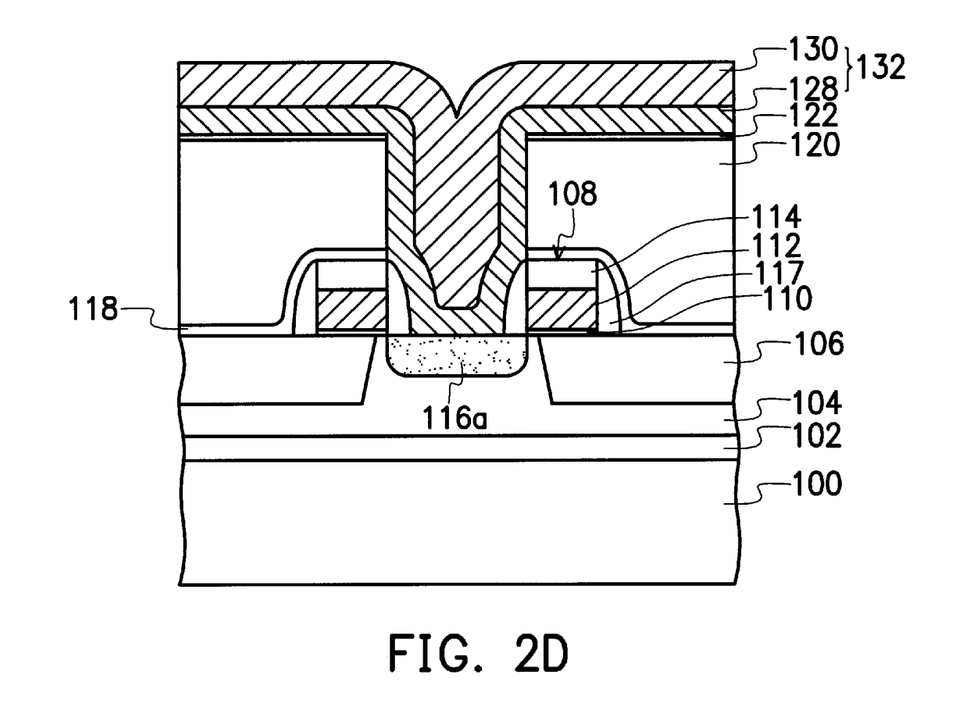
Figure 3D:
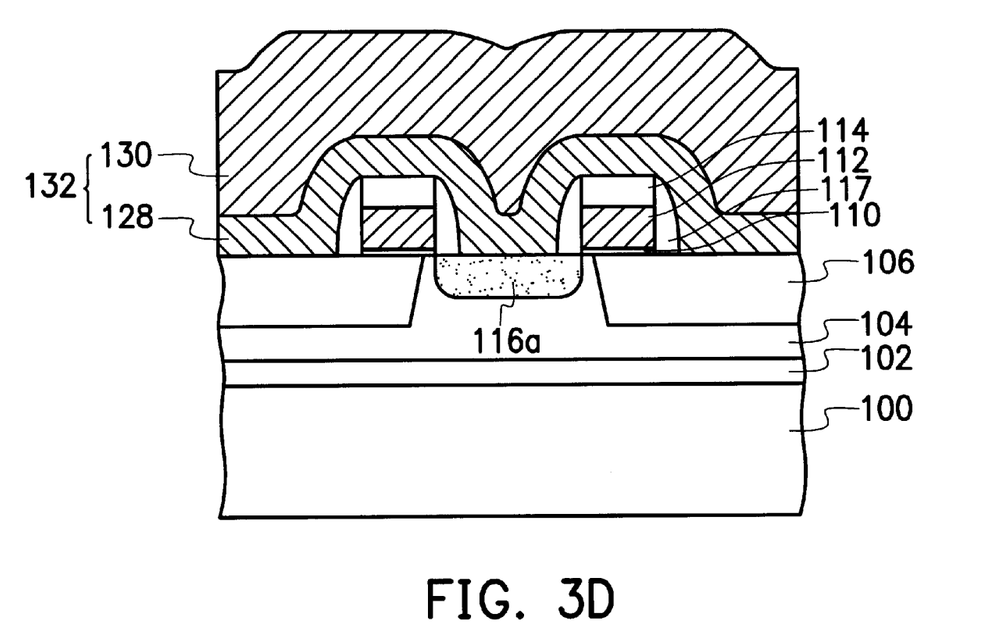

Referring to FIGS. 1, 2D and 3D, a conducting layer 132 is formed over the semiconductor substrate 100 and within the bit line contact holes 126 and the bit line trenches 127. A material of the conducting layer 132 comprises, for example, a doped polysilicon layer 128 using CVD process and metal silicide layer 130 through CVD process on the doped polysilicon layer 128.

Figure 2E:
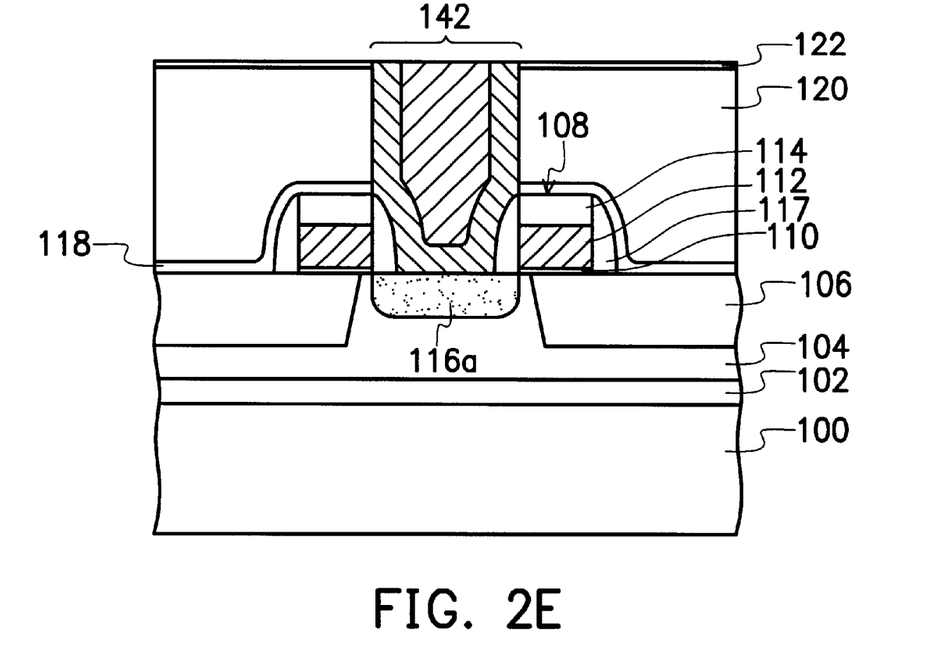
Figure 3E:
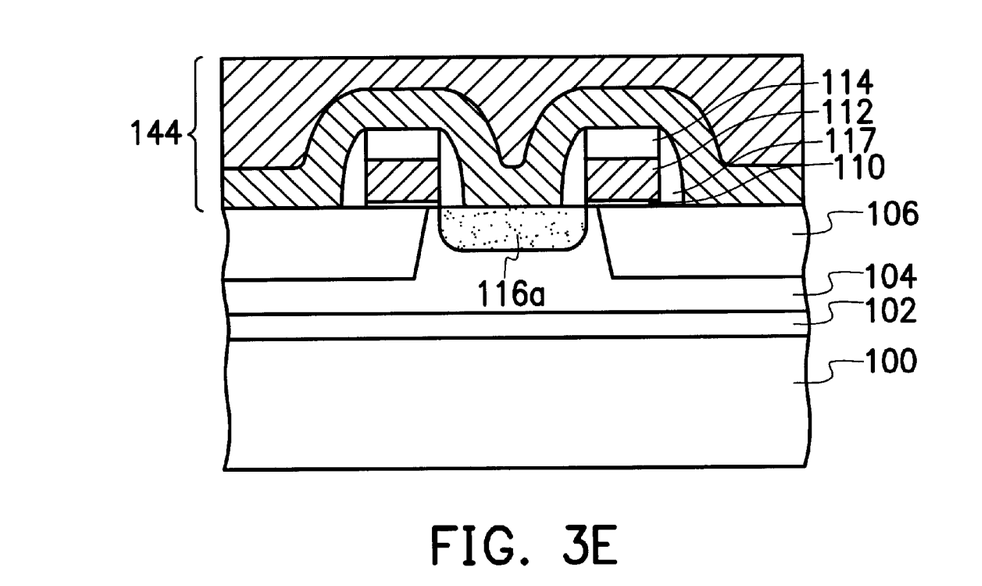

Referring to FIGS. 1, 2E and 3E, the conducting layer 132 is partially removed and planarized by preferably, for example, a chemical mechanical polishing process or etching back process until the surface of the BARC layer 122 is exposed. Consequently, the conducting layer 132 remaining in the contact holes 126 is used to form bit line contacts 142 that connect to the common source 116a. The conducting layer 132 remaining in the bit line trenches 127 is used to form bit lines 144.

The other steps are performed after the bit line contacts 142 and the bit lines 144 are formed. The other steps comprise, for example, forming the other dielectric layer, patterning the dielectric layer to form node contact openings therein and forming capacitors.

The present invention can reduce this process by one mask and many process since the bit lines 144 and the bit line contacts 142 are formed simultaneously in one lithographic and one etching process. The bit lines 144 and the bit line contacts 142 require one planarization process, so that the surface of the bit lines 144 and the bit line contacts 142 are about coplanar; consequently, the topography of the IC device fabricated according the present invention is reduced. Furthermore, the aspect ratio of the node contact holes 126 can be reduced because the height of the bit line contact is reduced, so that the step coverage of the metal layer filling in the node contact opening can be improved. For instance, in the 0.25 micrometer process, the height of the bit line contacts 142 is reduced from about 27000 Angstroms to about 22000 Angstroms; i.e., the aspect ratio of the bit line contact holes 126 is reduced from about 7.5 to about 6.1.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a bit line, comprising the steps of:

providing a semiconductor substrate having isolation structures formed therein;

forming gate structures on the semiconductor substrate, each gate structure having a cap layer;

forming a common source and a drain in the substrate;

forming a spacer on a sidewall of each gate structure;

forming a dielectric layer over the semiconductor substrate;

patterning the dielectric layer to simultaneously form a bit line contact hole and a bit line trench therein, wherein the bit line contact hole exposes the common source and the bit line trench is located over a part of the cap layer and a part of the isolation structures;

forming a blanket conducting layer over the semiconductor substrate within the bit line contact hole and the bit line trench and over the dielectric layer; and removing a part of the blanket conducting layer on the dielectric layer by an etching back process.

2. The method as claimed in claim 1, furthermore comprising forming a stop layer over the semiconductor substrate prior to the step of forming the dielectric layer over the semiconductor substrate.

3. The method as claimed in claim 2, wherein patterning the dielectric layer to form the bit line contact hole and the bit line trench therein comprises the step of:

forming a patterned photoresist layer on the dielectric layer; and etching the dielectric layer and the stop layer while using the patterned photoresist as mask to form the bit line contact hole and the bit line trench.

4. The method as claimed in claim 3, wherein etching the dielectric layer and the stop layer while using the patterned photoresist as mask to form the bit line contact hole and the bit line trench further comprises the steps of:

etching the dielectric layer while using the patterned photoresist as mask to expose a surface of the stop layer; and etching the stop layer to expose a part of the isolation structures, a part of the cap layer and the common source to form the bit line trench and the bit line contact hole.

5. The method as claimed in claim 1, wherein the bit line trench exposes the part of the cap layer and the part of the isolation structures.

6. The method as claimed in claim 1, wherein the dielectric layer is planarized.

7. The method as claimed in claim 1, wherein a bottom anti-reflection coating is formed on the dielectric layer prior to the step of patterning the dielectric layer.

8. A method of fabricating a bit line, comprising the steps of:
   providing a semiconductor substrate having isolation structures formed therein;
   forming gate structures on the semiconductor substrate, each gate structure having a cap layer;
   forming a common source and a drain in the substrate;
   forming a spacer on a sidewall of each gate structure;
   forming a dielectric layer over the semiconductor substrate;
   patterning the dielectric layer to simultaneously form a bit line contact hole and a bit line trench therein, wherein the bit line contact hole exposes the common source and the bit line trench is located over a part of the cap layer and a part of the isolation structures;
   forming a blanket conducting layer over the semiconductor substrate within the bit line contact hole and the bit line trench and over the dielectric layer; and
   removing a part of the blanket conducting layer on the dielectric layer by a chemical mechanical polishing process.

9. The method as claimed in claim 8, furthermore comprising forming a stop layer over the semiconductor substrate prior to the step of forming the dielectric layer over the semiconductor substrate.

10. The method as claimed in claim 9, wherein patterning the dielectric layer to form the bit line contact hole and the bit line trench therein comprises the step of:
    forming a patterned photoresist layer on the dielectric layer; and
    etching the dielectric layer and the stop layer while using the patterned photoresist as mask to form the bit line contact hole and the bit line trench.

11. The method as claimed in claim 10, wherein etching the dielectric layer and the stop layer while using the patterned photoresist as mask to form the bit line contact hole and the bit line trench further comprises the steps of:
    etching the dielectric layer while using the patterned photoresist as mask to expose a surface of the stop layer; and
    etching the stop layer to expose a part of the isolation structures, a part of the cap layer and the common source to form the bit line trench and the bit line contact hole.

12. The method as claimed in claim 8, wherein the bit line trench exposes the part of the cap layer and the part of the isolation structures.

13. The method as claimed in claim 8, wherein the dielectric layer is planarized.

14. The method as claimed in claim 8, wherein a bottom anti-reflection coating is formed on the dielectric layer prior to the step of patterning the dielectric layer.

15. A method of fabricating a bit line, comprising the steps of:
    providing a semiconductor substrate having isolation structures formed therein;
    forming gate structures on the semiconductor substrate, each gate structure having a cap layer;
    forming a common source and a drain in the substrate;
    forming a spacer on a sidewall of each gate structure;
    forming a dielectric layer over the semiconductor substrate;
    patterning the dielectric layer to simultaneously form a bit line contact hole and a bit line trench therein, wherein the bit line contact hole exposes the common source and the bit line trench is located over a part of the cap layer and a part of the isolation structures;
    forming a blanket conducting layer over the semiconductor substrate to fill the bit line contact hole and the bit line trench and over the dielectric layer; and
    removing a part of the blanket conducting layer on the dielectric layer by an etching back process to form a bit line contact within the bit line contact hole and a bit line within the bit line trench.

16. The method as claimed in claim 15, wherein the dielectric layer is planarized.

17. The method as claimed in claim 15, wherein a bottom anti-reflection coating is formed on the dielectric layer prior to the step of patterning the dielectric layer.

18. A method of fabricating a bit line, comprising the steps of:
    providing a semiconductor substrate having isolation structures formed therein;
    forming gate structures on the semiconductor substrate, each gate structure having a cap layer;
    forming a common source and a drain in the substrate;
    forming a spacer on a sidewall of each gate structure;
    forming a dielectric layer over the semiconductor substrate;
    patterning the dielectric layer to simultaneously form a bit line contact hole and a bit line trench therein, wherein the bit line contact hole exposes the common source and the bit line trench is located over a part of the cap layer and a part of the isolation structures;
    forming a blanket conducting layer over the semiconductor substrate to fill the bit line contact hole and the bit line trench and over the dielectric layer; and
    removing a part of the blanket conducting layer on the dielectric layer by a chemical mechanical polishing process to form a bit line contact within the bit line contact hole and a bit line within the bit line trench.

19. The method as claimed in claim 18, wherein the dielectric layer is planarized.

20. The method as claimed in claim 18, wherein a bottom anti-reflection coating is formed on the dielectric layer prior to the step of patterning the dielectric layer.

21. A method of fabricating a bit line, comprising the steps of:
    providing a semiconductor substrate having a common source;
    forming a dielectric layer over the semiconductor substrate;
    patterning the dielectric layer to simultaneously form a bit line contact hole and a bit line trench therein, wherein the bit line contact hole exposes the common source;
    forming a blanket conducting layer over the semiconductor substrate to fill the bit line contact hole and the bit line trench and to cover the dielectric layer; and
    removing a part of the blanket conducting layer on the dielectric layer by an etching back process.

22. A method of fabricating a bit line, comprising the steps of:

providing a semiconductor substrate having a common source;

forming a dielectric layer over the semiconductor substrate;

patterning the dielectric layer to simultaneously form a bit line contact hole and a bit line trench therein, wherein the bit line contact hole exposes the common source;

forming a blanket conducting layer over the semiconductor substrate to fill the bit line contact hole and the bit line trench and to cover the dielectric layer; and removing a part of the blanket conducting layer on the dielectric layer by a chemical mechanical polishing process.

* * * * *